United States Patent
Zimmer et al.

(10) Patent No.: US 10,670,386 B2
(45) Date of Patent: Jun. 2, 2020

(54) MULTI-TURN COUNTER SENSOR FAILURE DETECTION

(71) Applicant: Infineon Technologies AG, Neubiberg (DE)

(72) Inventors: Jürgen Zimmer, Neubiberg (DE); Thomas Bever, Munich (DE)

(73) Assignee: Infineon Technologies AG, Neubiberg (DE)

( * ) Notice: Subject to any disclaimer, the term of this patent is extended or adjusted under 35 U.S.C. 154(b) by 77 days.

(21) Appl. No.: 15/957,117

(22) Filed: Apr. 19, 2018

(65) Prior Publication Data
US 2019/0323819 A1   Oct. 24, 2019

(51) Int. Cl.
*G01B 7/30* (2006.01)
*G01R 35/00* (2006.01)
*G01D 5/12* (2006.01)

(52) U.S. Cl.
CPC .............. *G01B 7/30* (2013.01); *G01D 5/12* (2013.01); *G01R 35/00* (2013.01)

(58) Field of Classification Search
CPC ............ G01B 7/30; G01D 5/12; G01R 35/00
See application file for complete search history.

(56) References Cited

U.S. PATENT DOCUMENTS

| | | | |
|---|---|---|---|
| 2010/0013466 A1* | 1/2010 | Steinich | G01B 7/30 324/207.25 |
| 2011/0089936 A1* | 4/2011 | Putinier | G01D 5/145 324/207.25 |
| 2013/0015844 A1* | 1/2013 | Bogos | G01D 5/24452 324/207.2 |
| 2013/0289936 A1* | 10/2013 | Houda | G01B 5/24 702/151 |
| 2014/0021943 A1* | 1/2014 | Watanabe | G01B 7/30 324/207.21 |
| 2014/0159710 A1* | 6/2014 | Yu | G01P 13/04 324/207.25 |
| 2014/0290079 A1* | 10/2014 | Houda | G01D 5/12 33/1 PT |
| 2017/0082462 A1* | 3/2017 | Narasimhan | G01D 5/06 |
| 2018/0156676 A1* | 6/2018 | Neuschaefer-Rube | G01L 1/125 |
| 2019/0079141 A1* | 3/2019 | Marauska | G01R 33/0076 |

* cited by examiner

*Primary Examiner* — Dominic E Hawkins
(74) *Attorney, Agent, or Firm* — Harrity & Harrity, LLP

(57) ABSTRACT

Some aspects described herein involve a multi-turn counter (MTC) system that includes a first MTC sensor configured to sense a rotating magnetic field coupled to a rotatable object. The first MTC sensor may have a first sense of rotation detection. The MTC system may include a second MTC sensor may be configured to sense the rotating magnetic field. The second MTC sensor may have a second sense of rotation detection which is opposite to the first sense of rotation detection, and the second MTC sensor is configured to sense the rotating magnetic field according to the second sense of rotation.

20 Claims, 11 Drawing Sheets

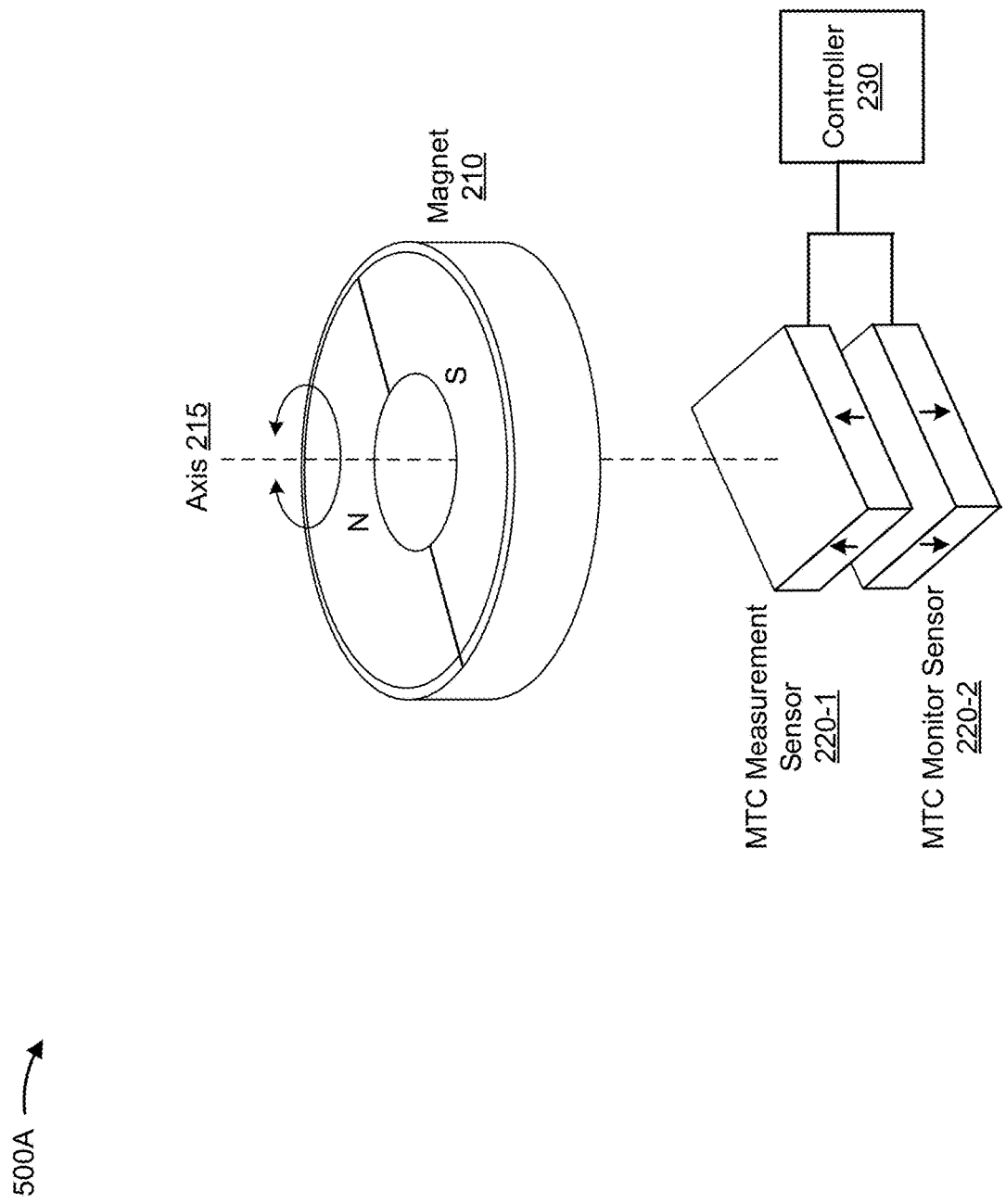

MULTI-TURN COUNTER SENSOR FAILURE DETECTION

BACKGROUND

A multi-turn counter (MTC) sensor may be used to determine a number of turns of an external rotating magnetic field (e.g., a number of full or partial rotations of the magnetic field) produced by a magnet (e.g., a magnet attached to or formed as part of a rotatable object). The MTC sensor may be a magnetoresistive (MR)-based sensor (e.g., an anisotropic magnetoresistive (AMR) sensor, a tunnel magnetoresistive (TMR) sensor, a giant magnetoresistive (GMR) sensor). In some instances, the MTC sensor may include a domain wall generator that generates a domain wall on a magnetized strip of the MTC sensor. The location of the domain wall on the magnetic strip of MTC sensor may be used to count the number of turns of the external magnetic field.

SUMMARY

According to some implementations, a multi-turn counter (MTC) system may include a first MTC sensor configured to sense a rotating magnetic field coupled to a rotatable object, wherein the first MTC sensor has a first sense of rotation detection; and a second MTC sensor configured to sense the rotating magnetic field, wherein the second MTC sensor has a second sense of rotation detection which is opposite to the first sense of rotation detection, and the second MTC sensor is configured to sense the rotating magnetic field according to the second sense of rotation.

According to some implementations, a device may include one or more processors to: receive a first measurement of a magnetic field, associated with a magnet, from a first multi-turn counter (MTC) sensor, wherein the first MTC sensor senses the magnetic field while positioned in a first configuration; receive a second measurement of the magnetic field from a second MTC sensor, wherein the second MTC sensor senses the magnetic field while positioned in a second configuration that causes the second MTC sensor to inversely sense the magnetic field relative to the first MTC sensor, and the second MTC sensor and the first MTC sensor are both a first type of MTC sensor; process the first measurement and the second measurement to verify that the first MTC sensor or the second MTC sensor is operable to measure a turn count of the magnet; and perform an action based on whether the first MTC sensor or the second MTC sensor are operable to determine the turn count of the magnet.

According to some implementations, a method may include receiving, by a device, a first set of measurements of a magnetic field, associated with a magnet, from a pair of MTC sensors, wherein the pair of MTC sensors are configured to inversely measure the magnetic field; calculating a sum of the first set of measurements of the magnetic field; receiving, by the device, a second set of measurements of the magnetic field from the pair of MTC sensors, wherein the second set of measurements are received after the first set of measurements; calculating, by the device, a sum of the second set of measurements; comparing, by the device, the sum of the first set of measurements with the sum of the second set of measurements; determining, by the device, that at least one of the pair of MTC sensors is not operable to measure a turn count of the magnet when the sum of the first set of measurements is not substantially the same as the sum of the second set of measurements; and performing, by the device, an action associated with at least one of the pair of MTC sensors not being operable to measure the turn count of the magnet.

BRIEF DESCRIPTION OF THE DRAWINGS

FIGS. 5A, 5B, 6, 7A and 7B are diagrams of example implementations of multi-turn counter systems associated with the example process shown in FIG. 4.

DETAILED DESCRIPTION

Figure 1:
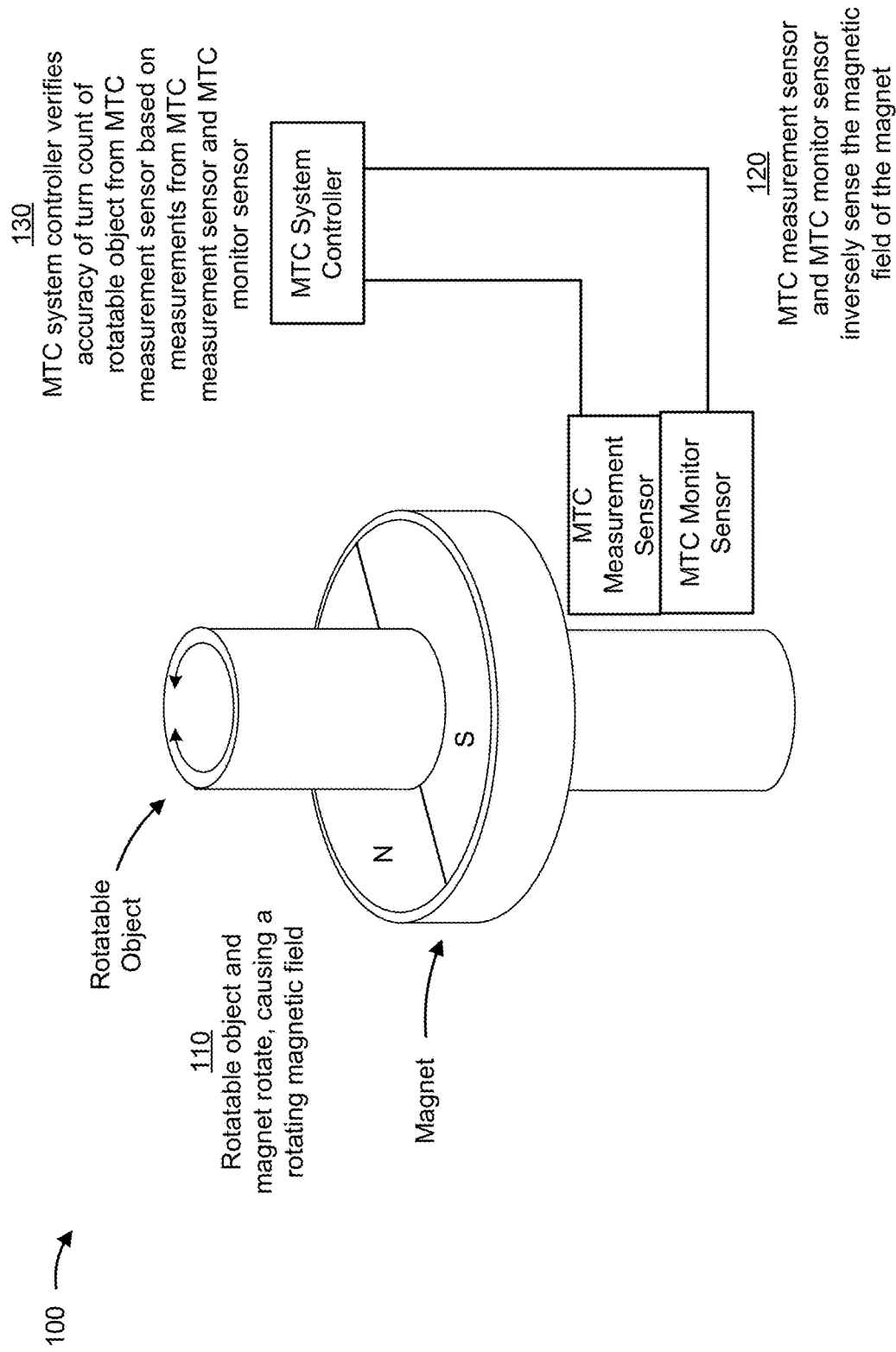
FIG. 1 is a diagram of an overview of an example implementation described herein.

The following detailed description of example implementations refers to the accompanying drawings. The same reference numbers in different drawings may identify the same or similar elements.

In some instances, an MTC sensor, such as an MR-based angle sensor, may include a magnetic strip and a domain wall generator (DWG) to generate a domain wall on the magnetic strip. The DWG may include a conductive material attached to or formed as part of the magnetic strip. In some cases, the DWG may have a larger dimension (e.g., a larger width or diameter) than a dimension (e.g., a width) of the magnetic strip. The DWG may generate a domain wall within the magnetic strip to enable the MTC sensor to determine a turn count of a rotatable object. For example, based on the location of the domain wall within the magnetic strip and/or a direction of a magnetic field of a magnet connected to the rotatable object, the MTC sensor may determine the turn count. Accordingly, as long as a position and/or number of domain walls (e.g., 180 degree domain walls) within an MTC sensor is affected only by a rotating magnetic field (e.g., generated by the magnet on the rotatable object), a controller may make a determination of a turn count (e.g., an applied number of turns) of the rotatable object. However, in some instances, a disturbance in the magnetic field can induce additional domain walls to be generated within the MTC sensor. The additional domain walls may affect the accuracy of determining the turn count in two different possible ways. For example, as a first option the additional domain walls may end up stored in the MTC sensor. Further, it is possible that the additional domain walls may erase a validly generated domain wall from the MTC sensor. In the presence of disturbance magnetic fields both effects may occur in combination. For example, a disturbance can be caused by another magnetic field, other than the sensed magnetic field, or a magnetic field that combines with the sensed magnetic field to exceed a threshold (e.g., a maximum) magnetic field strength to generate spontaneous additional domain walls in domain wall free regions within the magnetic strip of the MTC sensor. These spontaneous additional domain walls are however not in response of the rotation of the external magnetic field. In such cases, an accurate determination of the number of counts may not be possible and an MTC system using the MTC sensor may need to be recalibrated. According to some implementations described herein, a MTC system is provided to detect when a domain wall pattern of an MTC sensor is invalid and/or when an MTC sensor is not operable to determine an accurate turn count of a magnetic field.

Some implementations, described herein, provide an MTC system that includes a plurality of MTC sensors configured to measure a turn count of a rotatable object or magnet fixed to the rotatable object. An example controller of the MTC system can determine whether one or more of the MTC sensors are not accurately measuring the turn count based on a comparison of measurements from each of the plurality of MTC sensors. In some implementations, two MTC sensors can be configured within the MTC system to sense inverse measurements of the magnetic field from one another. In such cases, the controller may sum the measurements from the two MTC sensors and determine that a failure has occurred (e.g., that an innermost domain wall is in an unexpected location) when the sum differs from a fixed value and/or changes as the rotatable object (and corresponding magnet) rotates. In some implementations, the plurality of MTC sensors may include a set of master MTC sensors and a set of backup MTC sensors, such that when the master sensors fail, a controller can use the set of backup MTC sensors (which may be a different type of MTC sensor than the set of master MTC sensors) to determine the turn count and/or verify that the backup MTC sensors are operable to accurately determine the turn count. Additionally, or alternatively, when a failure is detected or occurs, a notification (e.g., an alert) can be sent to a user interface in communication with the MTC system.

Accordingly, as described herein, an MTC system is provided to ensure accurate turn count of a rotatable object (and/or corresponding magnetic field) and/or detection of failures of one or more MTC sensors. As such, the MTC system can ensure that a machine, device, or other system (e.g., a steering system of a vehicle, a clutch system of a vehicle, and/or the like), that is using the MTC system, is operating under proper conditions. Furthermore, further failures, caused by or associated with inaccurate turn counts, can be avoided in the MTC system and/or within a machine, device, or other system utilizing the MTC system. In such cases, processing resources, power resources, and/or the like can be conserved for the MTC system by avoiding use of inaccurate measurements and/or the failed MTC system.

As used herein, turn count may refer to a number of turns (e.g., in a clockwise rotational direction or in a counter-clockwise rotational direction) of an object from an originating position. In some implementations, a turn count may indicate one or more of a predefined fraction of a full rotation of a magnetic field sensed by the MTC sensor. In some implementations, a turn count may be configured to indicate one or more full rotations of the magnetic field in terms of a further predefined multiplicity of the predefined fractions. Accordingly, a turn count may be two turns counter-clockwise, one and a half turns clockwise, and/or the like.

FIG. 1 is a diagram of an overview of an example implementation 100 described herein. In FIG. 1, an example MTC sensor system utilizes two MTC sensors to verify that one or both of the MTC sensors are operable to accurately determine a turn count of a rotatable object. As shown in FIG. 1, a magnet is fixed to the rotatable object and the MTC sensors (shown as an MTC measurement sensor and an MTC monitor sensor) are configured to measure a magnetic field produced by the magnet. Accordingly, the MTC measurement sensor and the MTC monitor sensor of FIG. 1 are within a distance of the magnet that enables one or more domain walls of the MTC measurement sensor and/or MTC monitor sensor to move along structures (e.g., magnetic strips) of the MTC measurement sensor and/or MTC sensor corresponding to rotations of the rotatable object.

As shown in FIG. 1, and by reference number 110, the rotatable object (e.g., a rotatable shaft, such as a steering shaft, a drive shaft, and/or the like) and magnet rotate, causing a magnetic field of the magnet to rotate. The example rotatable object may rotate due to some external force (e.g., from a user, from an engine, and/or the like). As shown by reference number 120, the MTC measurement sensor and the MTC monitor sensor inversely sense the magnetic field of the magnet as the magnet rotates. For example, the MTC measurement sensor and the MTC monitor sensor may be a same type of sensor (e.g., sensors with a same structure to sense the magnetic field, and/or the like) that are configured to make inverse measurements of the magnetic field with respect to the sense of rotation. More specifically, the MTC measurement sensor may be arranged right side up, while the MTC monitor sensor may be arranged upside down. In some implementations, the MTC measurement sensor may be arranged on an opposite side of the magnet than the MTC monitor sensor. Due to the inverse configurations of the MTC measurement sensor and MTC monitor sensor, the rotating magnetic field from the magnet may inversely move domain walls through the respective structures of the MTC measurement sensor and the MTC monitor sensor.

As further shown in FIG. 1, and by reference number 130, an MTC system controller verifies an accuracy of a turn count of the rotatable object from the MTC measurement sensor based on measurements from the MTC measurement sensor and the MTC monitor sensor. For example, the MTC system controller may use measurements corresponding to locations of domain walls within the MTC measurement sensor and MTC monitor sensor. The MTC system controller may obtain the measurements from the MTC measurement sensor to determine a turn count of the rotatable object (e.g., based on a domain wall location within the MTC measurement sensor) and measurements from the MTC monitor sensor (e.g., based on a domain wall location within the MTC monitor sensor) to verify that the measurements from the MTC measurement sensor are accurate. In some implementations, the MTC system controller may verify the accuracy by summing the measurements (e.g., measurements made at corresponding times or positions of the rotatable object) from the MTC measurement sensor and the measurements from the MTC monitor sensor. If the sum of the measurements does not remain fixed (e.g., within a threshold range of a fixed value) as the rotatable object rotates, because the measurements are configured to be inverses of each other, then the MTC system controller may determine that the measurements from the MTC measurement sensor (and/or from the MTC monitor sensor) are not accurate. In some implementations, the MTC system controller may send a notification of the inaccurate measurements, shutdown the MTC system, utilize backup MTC sensors, and/or the like.

Accordingly, the example implementation 100 of an MTC system, as shown in FIG. 1 may be used to detect measurement failures of an MTC sensor using a plurality of MTC sensors. In such cases, errors and/or failures within the MTC system and/or within a machine, device, or other system utilizing the MTC system can be avoided. Avoidance of such failures can conserve processing resources, power resources, and/or the like that may otherwise be used during failed operation.

As indicated above, FIG. 1 is provided merely as an example. Other examples are possible and may differ from what was described with regard to FIG. 1.

Figure 2:
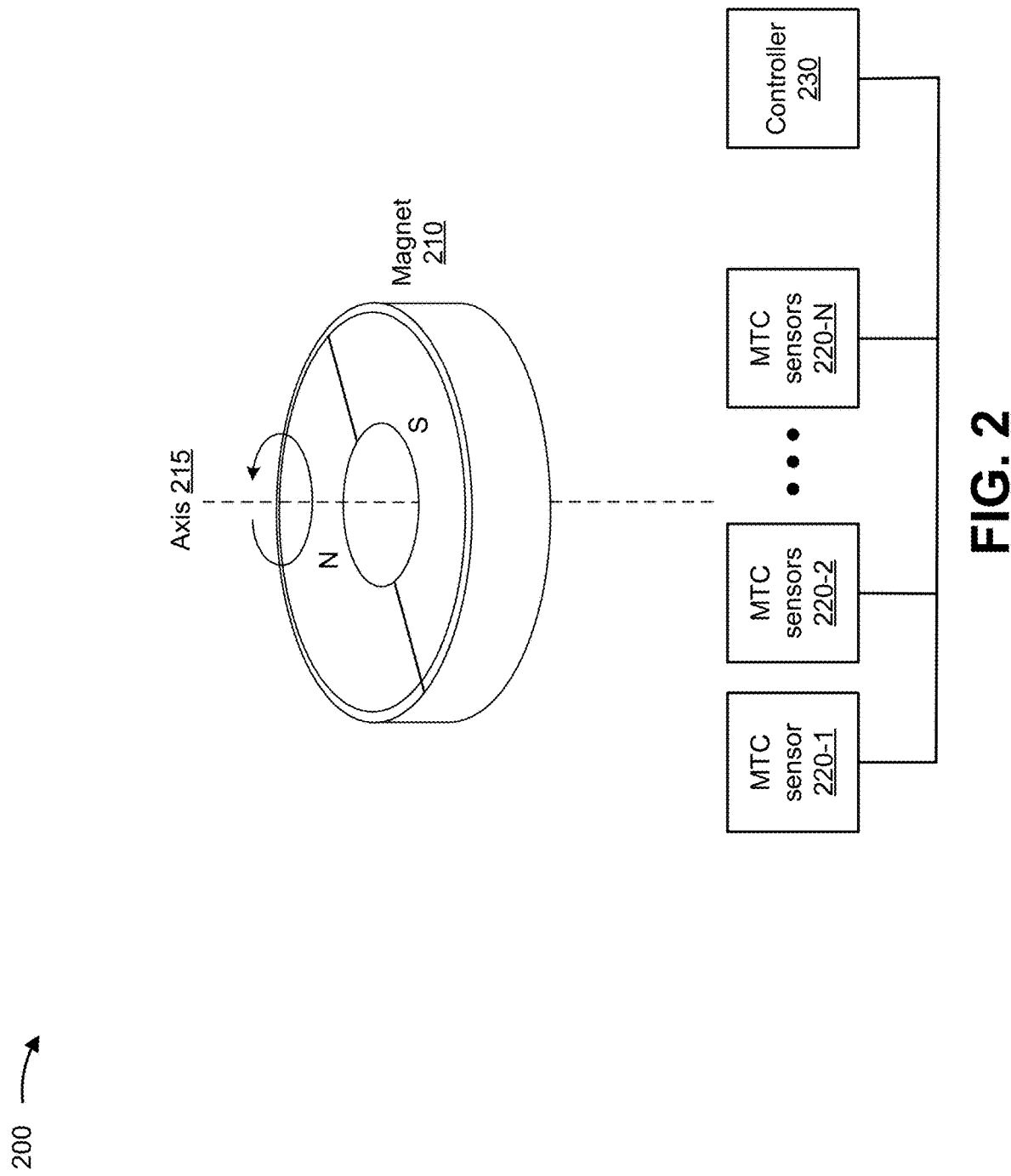
FIG. 2 is a diagram of an example environment in which systems and/or methods, described herein, may be implemented.

FIG. 2 is a diagram of an example environment 200 in which apparatuses described herein may be implemented. As shown in FIG. 2, environment 200 may include a magnet 210 that may rotate about an axis 215, one or more MTC sensors 220-1 through 220-N (where N is an integer and N≥1) (hereinafter referred to collectively as "MTC sensors 220," and individually as "MTC sensor 220"), and a controller 230.

Magnet 210 includes one or more magnets positioned to rotate about axis 215 (e.g., an imaginary line). In some implementations, magnet 210 may be connected (e.g., mechanically) to a rotatable object (not shown) such that a rotation angle and/or turn count of magnet 210 corresponds to a rotation angle and/or turn count of the rotatable object (e.g., when there exists a non-slip relation between an end face of the rotatable object and magnet 210).

In the example environment 200 shown in FIG. 2, magnet 210 comprises a first half forming a north pole (N) and a second half forming a south pole (S), so that magnet 210 comprises one pole pair. In some implementations, magnet 210 may, without limitation, comprise more than one pole pair. In some implementations, magnet 210 may include a disk magnet that is positioned concentrically about axis 215 that passes through the center of magnet 210, as shown in FIG. 2. While magnet 210 is shown as circular in FIG. 2, magnet 210 may be another shape, such as a square, a rectangular, an ellipse, or the like. In some implementations, magnet 210 may be of an elliptical shape in an instance where an angle between a plane corresponding to a surface of magnet 210 and axis 215 deviates from a substantially perpendicular relation. The plane may include a plane symmetrically cutting through magnet 210 and including a magnet center of magnet 210. In some implementations, the plane may be substantially perpendicular to axis 215. As another example, magnet 210 may include a ring magnet that is positioned to rotate about axis 215 (along with the rotatable object). A ring magnet may be of interest for an arrangement of magnet 210 at an end of the rotatable object.

In some implementations, magnet 210 may include two alternating poles on at least two portions of magnet 210. For example, magnet 210 may include a diametrically magnetized magnet with a north pole on a first half of magnet 210 and a south pole on a second half of magnet 210, as shown in FIG. 2. As another example, magnet 210 may include an axially magnetized magnet with a first north pole and a first south pole stacked on a first half of magnet 210, and a second south pole and a second north pole stacked on a second half of magnet 210 (not shown).

Additionally, or alternatively, magnet 210 may include a dipole magnet (e.g., a dipole bar magnet, a circular dipole magnet, an elliptical dipole magnet, etc.), a permanent magnet, an electromagnet, a magnetic tape, or the like. Magnet 210 may be comprised of a ferromagnetic material (e.g., Hard Ferrite), and may produce a magnetic field. Magnet 210 may further comprise a rare earth magnet which may be of advantage due to an intrinsically high magnetic field strength of rare earth magnets. As described above, in some implementations, magnet 210 may be attached to or integrated into a rotatable object for which a rotational angle and/or turn count may be determined (e.g., by MTC sensor 220, by controller 230) based on a rotational angle and/or turn count of magnet 210.

MTC sensors 220 includes one or more apparatuses for sensing components of a magnetic field for use in determining a turn count (e.g., of magnet 210, of a rotatable object to which magnet 210 is attached or formed as a part of, etc.). For example, MTC sensors 220 may include one or more circuits (e.g., one or more integrated circuits) and/or one or more structures (e.g., magnetic strips). In some implementations, MTC sensors 220 may be placed in positions relative to magnet 210 such that MTC sensors 220 may detect components of the magnetic field produced by magnet 210. In some implementations, MTC sensors 220 may include an integrated circuit that includes an integrated controller 230 (e.g., such that an output of MTC sensor 220 may include information that describes a rotational angle and/or turn count of magnet 210 and/or the rotatable object).

In some implementations, MTC sensor 220 may include a group of sensing elements configured to sense components of the magnetic field, produced by magnet 210, that are present at MTC sensors 220. For example, MTC sensor 220 may include a first sensing element (e.g., arranged substantially on a first plane proximal to magnet 210) associated with determining the rotational angle and/or turn count and a second sensing element (e.g., arranged substantially on a second plane distal to magnet 210) associated with determining the rotational angle and/or turn count. In some implementations, MTC sensors 220 are capable of operating in a non-saturated mode (i.e., output signals associated with sensing elements of MTC sensor 220 are dependent on a strength of the magnetic field).

Controller 230 includes one or more circuits associated with determining a rotational angle and/or turn count of magnet 210 (and/or the rotatable object), and providing information associated with the turn count of magnet 210. For example, controller 230 may include one or more circuits (e.g., an integrated circuit, a control circuit, a feedback circuit, and/or the like). Controller 230 may receive input signals from one or more sensors, such as one or more of MTC sensors 220, may process the input signals (e.g., using an analog signal processor, a digital signal processor, etc.) to generate an output signal, and may provide the output signal to one or more other devices or systems. For example, controller 230 may receive one or more input signals from MTC sensors 220, use the one or more input signals to determine whether one or more of the MTC sensors are accurately measuring a turn count of magnet 210, and generate an output signal comprising an angular position or turn count of magnet 210 (and/or the rotatable object) and/or an output signal comprising an indication of whether the MTC sensors are operable (e.g., whether measurements from one or more of the MTC sensor are accurate).

The number and arrangement of apparatuses shown in FIG. 2 are provided as an example. In practice, there may be additional apparatuses, fewer apparatuses, different apparatuses, or differently arranged apparatuses than those shown in FIG. 2. Furthermore, two or more apparatuses shown in FIG. 2 may be implemented within a single apparatus, or a single apparatus shown in FIG. 2 may be implemented as multiple, distributed apparatuses. Additionally, or alternatively, a set of apparatuses (e.g., one or more apparatuses) of environment 200 may perform one or more functions described as being performed by another set of apparatuses of environment 200.

Figure 3:
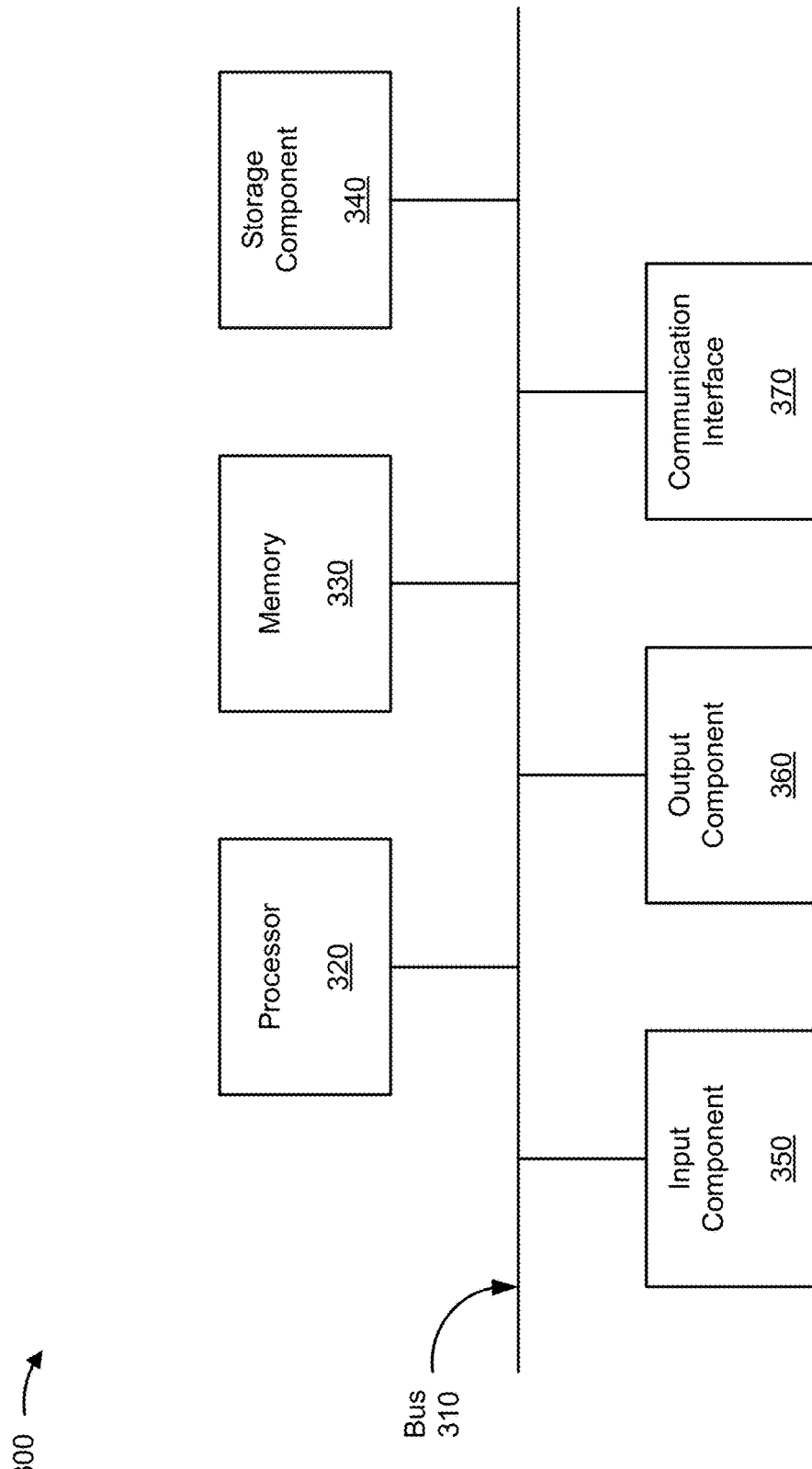
FIG. 3 is a diagram of example components of one or more devices of FIG. 2.

FIG. 3 is a diagram of example components of a device 300. Device 300 may correspond to one or more MTC sensors 220 and/or controller 230 of FIG. 2. In some implementations, MTC sensors 220 and/or controller 230 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more light-emitting diodes (LEDs)).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes based on processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
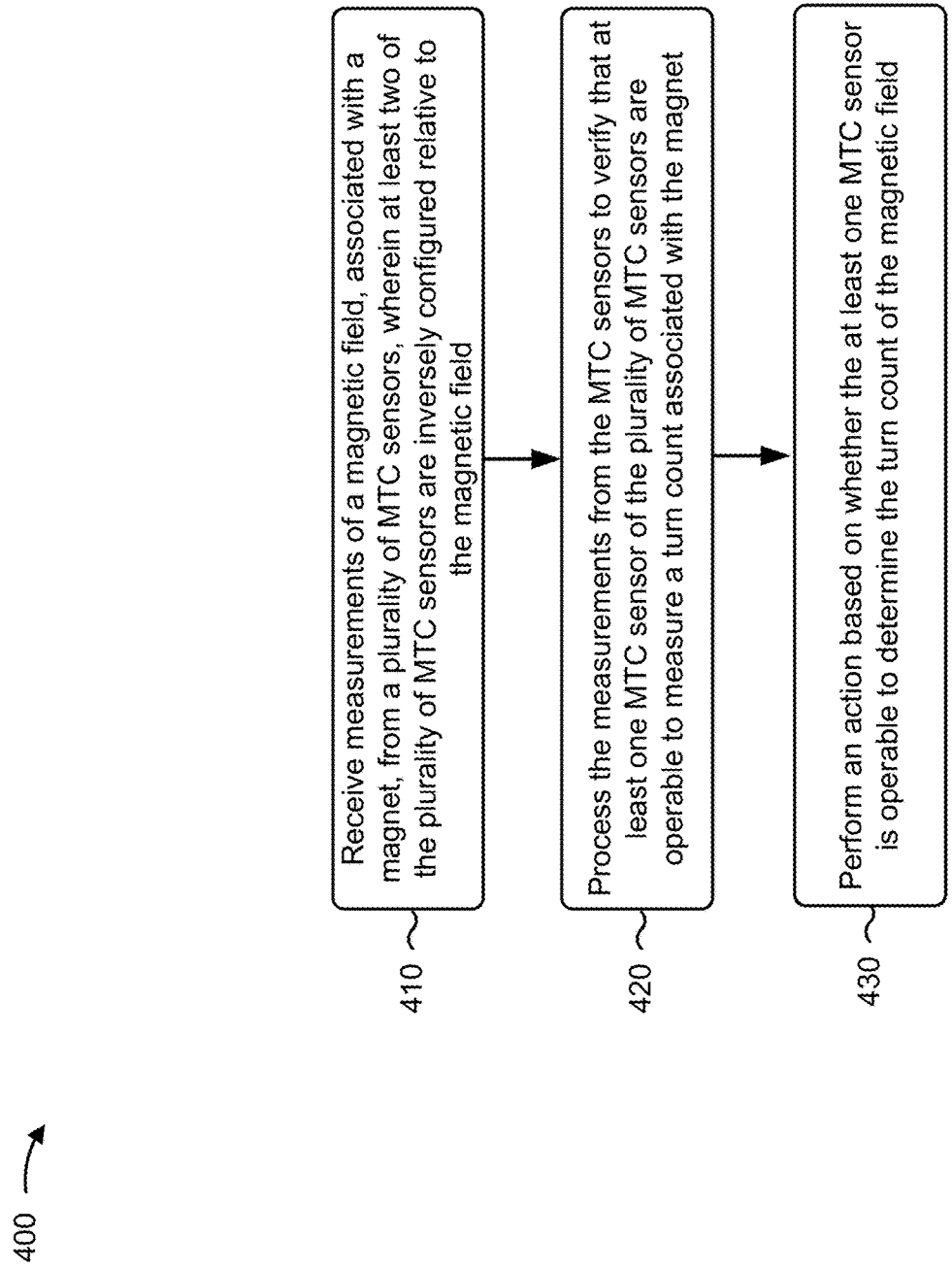
FIG. 4 is a flow chart of an example process for multi-turn counter sensor failure detection.

FIG. 4 is a flow chart of an example process 400 for multi-turn counter sensor failure detection. In some implementations, one or more process blocks of FIG. 4 may be performed by controller 230. In some implementations, one or more process blocks of FIG. 4 may be performed by another device or a group of devices separate from or including controller 230, such as MTC sensors 220.

As shown in FIG. 4, process 400 may include receiving measurements of a magnetic field, associated with a magnet, from a plurality of MTC sensors, wherein at least two of the plurality of MTC sensors are inversely configured relative to the magnetic field (block 410). For example, controller 230 may receive measurements of a magnetic field of magnet 210 from a plurality of MTC sensors 220. In some implementations, controller 230 may receive the measurements based on a schedule associated with MTC sensors 220 measuring the magnetic field, based on detecting a rotatable object associated with magnet 210 rotating, based on MTC sensors 220 sensing a rotation of the magnet, based on MTC sensors 220 measuring the magnetic field associated with the magnet, based on being powered on, based on an MTC system associated with controller 230 being powered on, and/or the like.

According to some implementations, a measurement may include any value or information measured or sensed by MTC sensor 220. For example, measurements may include or be representative of locations of one or more domain walls (e.g., 180 degree domain walls) in a structure of MTC sensor 220. In some implementations, the measurement may be a voltage measurement from one or more half-bridges of a structure (e.g., a magnetic strip) of MTC sensor 220. Based on the voltage measurement, controller 230 and/or MTC sensor 220 may determine a location of a domain wall within the MTC sensor (e.g., the location of a domain wall along a structure of the MTC sensor).

In some implementations, two of the plurality of MTC sensors 220 can be inversely configured relative to magnet 210 such that the two MTC sensors 220 inversely sense the magnetic field. Accordingly, when the two MTC sensors 220 are a same type of MTC sensor 220, controller 230 may receive measurements that are inverses of each other from the two MTC sensors 220. For example, two of MTC sensors 220 may be a same type when the two MTC sensors have a same structure, or substantially the same structure (e.g., a same magnetic strip), with a same shape (e.g., a same spiral shape, a same crossing pattern shape, a same sense of rotation of the loop structure, and/or the like), a same dimension (e.g., a same width, a same length, and/or the like), a same material, and/or the like. Accordingly, if the two MTC sensors 220, being of the same type, are configured inversely to one another relative to the magnet, the two MTC sensors 220 may inversely sense the magnetic field of magnet 210 and provide measurements that are inverses of one another to controller 230. For example, the measurements may be inverses of one another due domain walls being located at inverse locations of structures of the respective MTC sensors 220 based on the rotations and/or turns of magnet 210 (and corresponding magnetic field). For example, when a first MTC sensor 220-1 includes one or more domain walls caused by a rotating external magnetic field, a second MTC sensor 220-2 may be emptied from domain walls, such that the first MTC sensor 220-1 indicates a growing number of turn counts whereas the second MTC sensor 220-2 indicates a decreasing number of turn counts.

In some implementations, controller 230 may receive corresponding sets of measurements from MTC sensors 220, such that at least two MTC sensors 220 make corresponding measurements at a same or substantially the same moment in time. Accordingly, controller 230 may receive measurements from all MTC sensors 220 and/or a portion of the MTC sensors at a same time, such that corresponding sets of measurements can be compared to determine whether at least one or more of the MTC sensors 220 are operable to accurately determine a turn count associated with magnet 210 (and/or a corresponding rotatable object).

In this way, controller 230 may receive measurements from MTC sensors 220 to permit controller 230 to process the measurements to determine whether a failure associated with one or more MTC sensors 220 has occurred and/or whether MTC sensors 220 are function properly.

As further shown in FIG. 4, process 400 may include processing the measurements from the MTC sensors to verify that at least one MTC sensor of the plurality of MTC sensors are operable to measure a turn count associated with the magnet (block 420). For example, controller 230 may analyze or compare the measurements from MTC sensors 220. In some implementations, controller 230 may process the measurements based on receiving the measurements from MTC sensors 220, based on detecting a rotation of the magnet, and/or the like.

According to some implementations, controller 230 processes the measurements by analyzing the measurements according to configurations and/or settings (e.g., default settings, settings received via a user input, and/or the like) of controller 230 and/or an MTC system of controller 230. In some implementations, controller 230 may process the measurements by performing an operation on the measurements to determine a value that may be representative of an operability of one or more MTC sensors 220. For example, controller 230 may calculate a sum of a set of measurements that includes measurements from at least two MTC sensors 220 (e.g., a pair of MTC sensors 220 that are configured to make inverse measurements of the magnetic field), taken at a same or substantially the same moment in time, to determine a value of the sum of the measurements. The value of the sum of the measurements may indicate a failure and/or operability of at least one of the two MTC sensors 220. Therefore, controller 230 may use the measurements (or a comparison of the measurements or a value of the sum of the measurements) to verify that MTC sensors are operable to determine the turn count of magnet 210.

In some implementations, controller 230 may process and/or compare a series (or sequence) of measurements and/or a series of sums of measurements to determine whether the measurements and/or the sums of measurements change as magnet 210 rotates. For example, if controller 230 determines, from a series of measurements that a sum of the measurements from two MTC sensors 220 changes (i.e., does not remain a constant value within a threshold), then controller 230 may determine that one of the two MTC sensors 220 has failed and/or is inoperable. As such, controller 230 may determine a first sum of measurements from MTC sensors 220 and compare that sum to a previous sum of measurements from MTC sensors 220 to determine whether the sums have changed or remain fixed. Due to the inverse configuration, if the sums have changed, controller 230 may determine that a failure has occurred, while if the sums remain fixed or constant, controller 230 may determine that a failure had not occurred and that the MTC sensors 220 are operable to determine the turn count of magnet 210.

According to some implementations, controller 230 may determine that at least one of the MTC sensors 220 has failed or is inoperable based on comparing and/or processing measurements from MTC sensors 220. In such cases, a failed MTC sensor 220 may have generated a domain wall (e.g., due to a disturbance in the magnetic field of magnet 210) within a structure of the failed MTC sensor 220 that affects voltage measurements from one or more half-bridges of the MTC sensors 220. Accordingly, the measurements from MTC sensors 220, when summed, may not remain a fixed value as magnet 210 rotates because a domain wall was improperly generated or moved within a structure of the failed MTC sensor 220. In such cases, the voltage measurements may not remain constant because locations of one or more domain walls (e.g., an innermost domain wall that indicate the turn count associated with magnet 210) in the two MTC sensors 220 may not correspond to one another, thus changing the expected constant sum.

In this way, controller 230 may compare or process measurements from MTC sensors 220 to permit controller 230 to determine the operability of MTC sensors 220 and/or perform an action association with determining the operability of MTC sensors 220.

As further shown in FIG. 4, process 400 may include performing an action based on whether the at least one MTC sensor is operable to determine the turn count of the magnetic field (block 430). For example, controller 230 may perform the action. In some implementations, controller 230 may perform the action based on comparing the measurements from MTC sensors 220.

According to some implementations, if controller 230 determines, based on comparing the measurements, that a set of MTC sensors 220 are operable to determine the turn count associated with magnet 210 (e.g., the measurements from the set of MTC sensors 220, when summed, remain a fixed value over a most recent period of time), then controller 230 may continue to monitor and/or receive measurements from the set of MTC sensors 220.

In some implementations, controller 230 may determine, based on comparing the measurements, that a failure has occurred and/or that at least one of the set of MTC sensors are not operable to determine the turn count associated with magnet 210 (e.g., the measurements from the set of MTC sensors 220, when summed, do not remain a fixed value over a most recent period of time). In such cases, controller 230 may perform an action that includes deactivating the set of MTC sensors 220 (which may be master MTC sensors) and activating a set of backup MTC sensors 220 to determine the turn count associated with magnet 210. Additionally, or alternatively, MTC sensor 220 may send a notification (e.g., a message, text, data, an email, an image, an audio output, a video output, and/or the like) to a user interface to permit the user interface to indicate a failure of one or more of the set of MTC sensors 220 (e.g., present an alert via a display, sound an alarm using a speaker, and/or the like). In such cases, the notification may indicate that the one or more MTC sensors 220 is to be recalibrated to enable the MTC sensors to accurately determine the turn count associated with magnet 210.

In this way, controller 230 may perform an action that ensures MTC sensors 220 are operable to determine the turn count associated with magnet 210, addresses any failures or inoperability of MTC sensors 220, and/or enables any failures or inoperability of MTC sensors to be addressed (e.g., by a user, via a recalibration, and/or the like).

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5B:
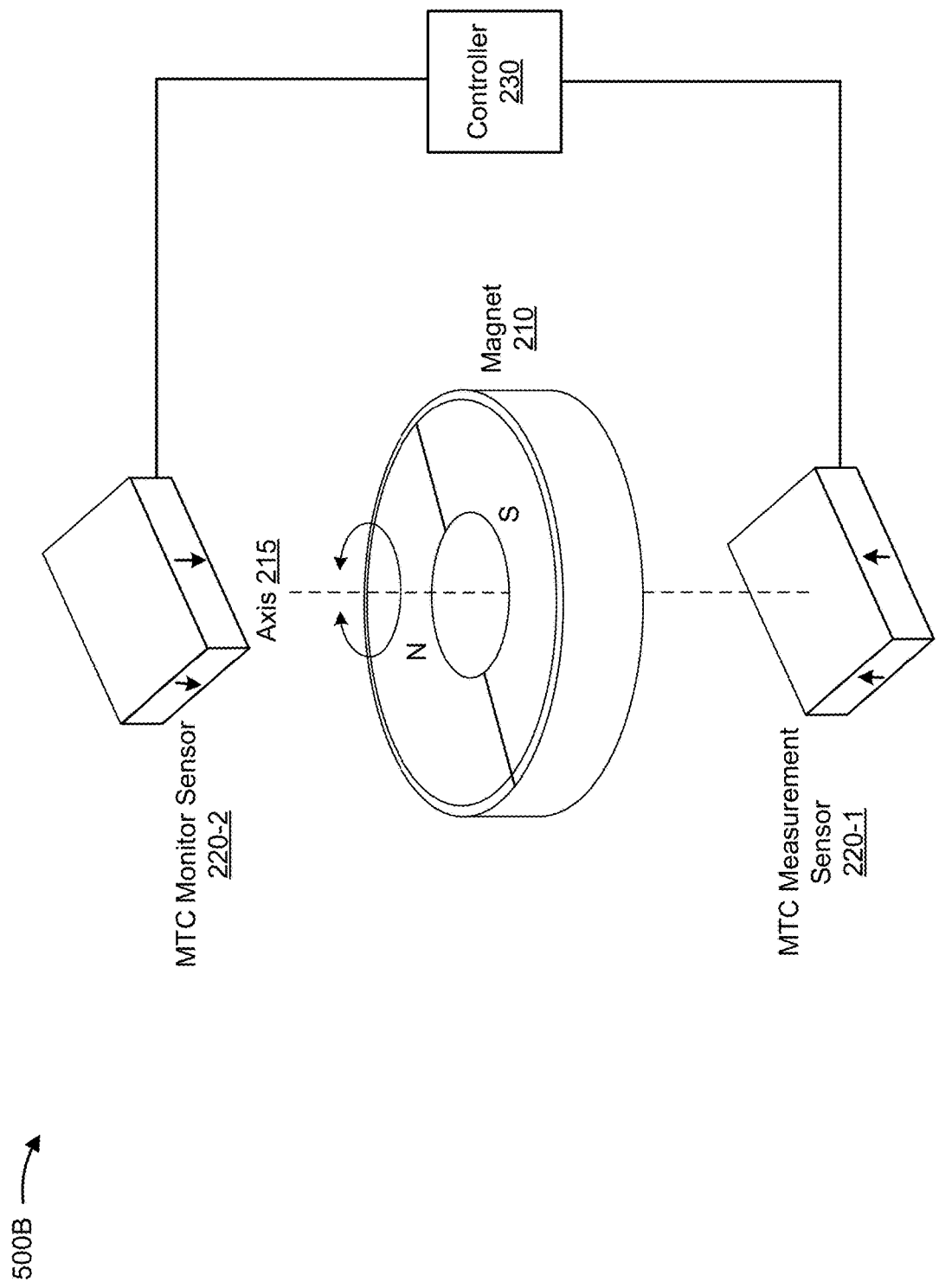

FIGS. 5A and 5B are diagrams of example implementations 500A, 500B relating to example process 400 shown in FIG. 4. FIGS. 5A and 5B show an example implementation of an MTC system that includes multi-turn counter sensor failure detection. In example implementation 500A of FIG. 5A, two MTC sensors 220, shown as MTC measurement sensor 220-1 and MTC monitor sensor 220-2 (which may be referred to collectively as MTC sensors 220 and correspond to MTC sensors 220 of FIG. 2), and a controller 230 (which may correspond to controller 230 of FIG. 2). The MTC sensors 220 and controller 230 of example implementations 500A and 500B are configured to measure a turn count of magnet 210 as magnet 210 rotates about axis 215. Controller 230 may determine a turn count associated with magnet 210 based on measurements from MTC measurement sensor 220-1 and verify that MTC measurement sensor 220-1 and/or MTC monitor sensor 220-2 are operable to determine the turn count associated with magnet 210 based on measurements from MTC monitor sensor 220-2. Accordingly, controller 230 of example implementations 500A and 500B may determine the turn count and verify the accuracy of the turn count using MTC measurement sensor 220-1 and MTC monitor sensor 220-2.

As shown in example implementation 500A in FIG. 5A, MTC measurement sensor 220-1 and MTC monitor sensor 220-2 are configured on a same axial side of magnet 210. As shown in example implementation 500B in FIG. 5B, MTC measurement sensor 220-1 and MTC monitor sensor are configured on opposite axial sides of magnet 210. As further shown in examples implementations 500A and 500B (by the arrows of MTC measurement sensor 220-1 and MTC monitor sensor 220-2 being in opposite directions), the orientation of MTC measurement sensor 220-1 and MTC monitor sensor 220-2 are inverse, such that MTC measurement sensor 220-1 is inverted relative to MTC monitor sensor 220-2. Accordingly, a magnetic field (e.g., associated with magnet 210), when sensed by MTC measurement sensor 220-1 and MTC monitor sensor 220-2 may cause domain walls to inversely traverse respective structures of MTC measurement sensor 220-1 and MTC monitor sensor 220-2. Therefore, MTC measurement sensor 220-1 may have a first sense of rotation detection of magnet 210 (e.g., a clockwise or counterclockwise sense of rotation in a plane defined by or parallel to the MTC measurement sensor 220-1) and the MTC monitor sensor 220-2 may have a second sense of rotation detection of magnet 210 that is opposite the first sense of rotation detection.

Accordingly, controller 230, when summing measurements, affected by locations of the domain walls, from MTC measurement sensor 220-1 and MTC monitor sensor 220-2 may determine that MTC measurement sensor 220-1 and/or MTC monitor sensor 220-2 are operable to determine the turn count associated with magnet 210 when the value of the summed measurements remains fixed over a period of time. On the other hand, if the value of the summed measurements changes as magnet 210 rotates, controller 230 may determine that a failure has occurred and at least one of MTC measurement sensor 220-1 or MTC monitor sensor 220-2 is not operable to accurately determine the turn count associated with magnet 210.

As indicated above, FIGS. 5A and 5B are provided merely as examples. Other examples are possible and may differ from what was described with regard to FIGS. 5A and 5B.

Figure 6:
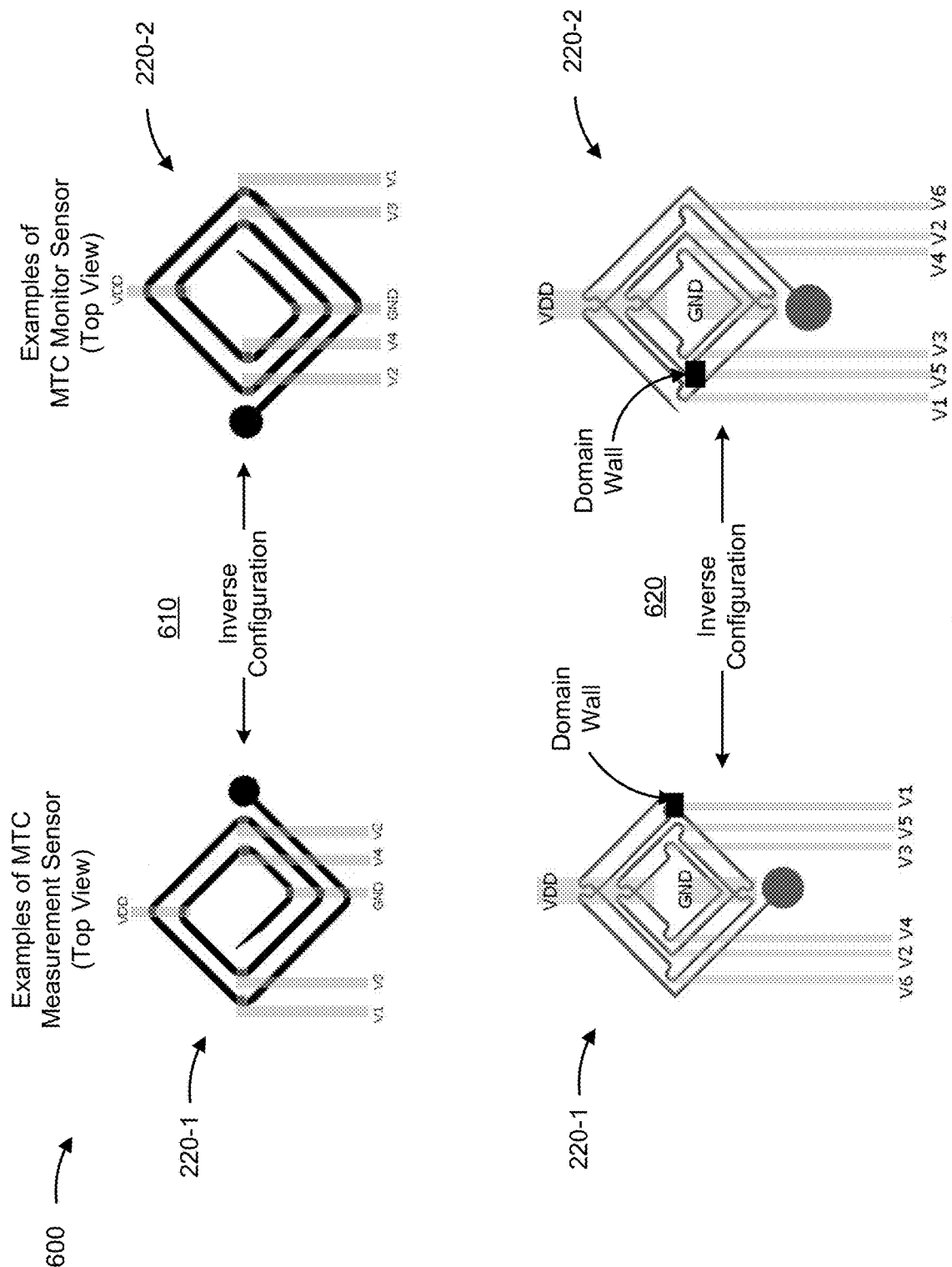

FIG. 6 is a diagram of an example implementation 600 relating to example process 400 shown in FIG. 4. FIG. 6 shows examples of structures of MTC sensors 220 of FIGS. 5A and 5B. As shown by reference number 610, a same quadratic spiral structure (e.g., magnetic strip) may be implemented within MTC measurement sensor 220-1 and MTC monitor sensor 220-2, though the structures are inverted (e.g., due to a package or housing of the MTC sensors 220 being inverted relative to one another or due to the structures of MTC sensors 220 having an opposite configuration within the respective packages of MTC sensors 220). A plurality of half-bridges (V1-V4) are shown between supply voltage taps VDD and ground taps GND of the quadratic spiral structure. In FIG. 6, the quadratic spiral structures are shown from a top view to be inverted from one another (as shown in FIGS. 5A and 5B).

In some aspects, in a starting state of example implementation 600 of FIG. 6, MTC measurement sensor 220-1 may include a domain wall at every second edge and MTC monitor sensor 220-2 may not include any domain walls. Upon rotation of a magnetic field, which is inversely sensed by MTC measurement sensor 220-1 and MTC monitor sensor 220-2, a position of an innermost domain wall may change for MTC measurement sensor 220-1 (e.g., from an outer position to an inner position) and a position of an innermost domain wall may inversely change for MTC monitor sensor 220-2 (e.g., from an inner position to an outer position). For example, from the starting state, after a ¾ turn, an innermost domain wall for the MTC measurement sensor 220-1 may be at V2 and for the MTC monitor sensor 220-2 the innermost domain wall may be at V3.

As further shown in FIG. 6, and by reference number 620, a same, but inverted, non-spiral structure may be implemented within MTC measurement sensor 220-1 and MTC monitor sensor 220-2. A plurality of half-bridges (V1-V6) are shown between supply voltage taps VDD and ground taps GND of the non-spiral structures. In FIG. 6, the non-spiral structures are shown from a top view to be inverted from one another. Similar to the quadratic spiral structure, upon rotation of a magnetic field, which is inversely sensed by MTC measurement sensor 220-1 and MTC monitor sensor 220-2, a position of an innermost domain wall may change for MTC measurement sensor 220-1 and a position of an innermost domain wall may inversely change for MTC monitor sensor 220-2. For example, after a half rotation from the starting state (where MTC measurement sensor 220-1 includes a domain wall every second edge and MTC monitor sensor 220-2 does not include any domain walls), MTC measurement sensor 220-1 may include an innermost domain wall after a half rotation at V1, while MTC monitor sensor 220-2 may have an innermost domain wall at V5.

Using the measurements from the half-bridges of the MTC sensors 220 of FIG. 6, controller 230 may determine whether one or both of the MTC sensors 220 are operable to determine a turn count associated with magnet 210. For example, when summing corresponding half-bridge values from the spiral structure shown with reference to reference number 610 and/or corresponding half-bridge values from the non-spiral structure shown with reference to reference number 620, controller 230 may determine that at least one of the MTC sensors 220 are inoperable if the value of the sum does not remain fixed as magnet 210 rotates. Accordingly, the example implementation 600 enables controller 230 to determine a turn count of magnet 210 and verify that MTC sensors 220 are operable to accurately determine the turn count of magnet 210.

As indicated above, FIG. 6 is provided merely as an example. Other examples are possible and may differ from what was described with regard to FIG. 6.

Figure 7A:
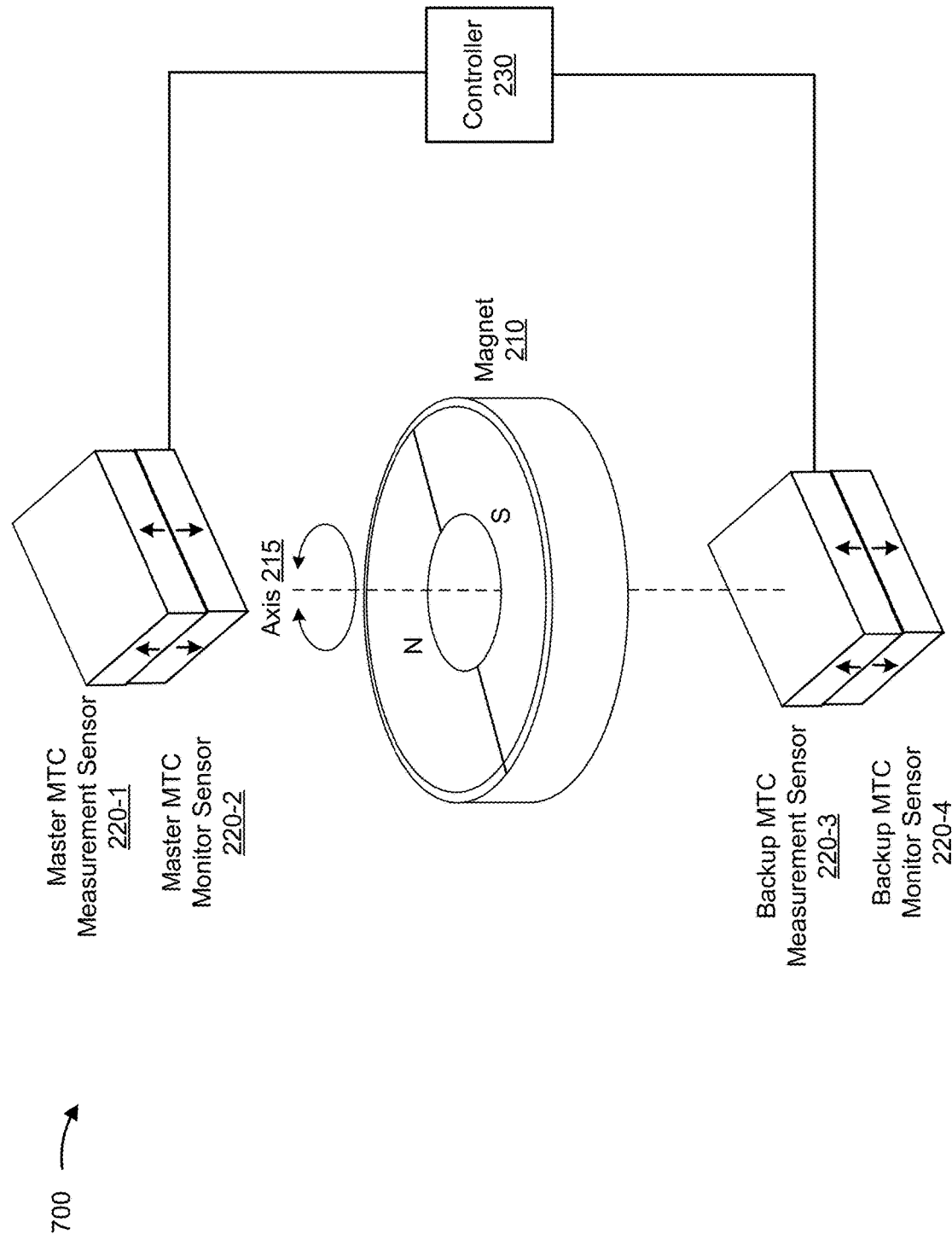
Figure 7B:
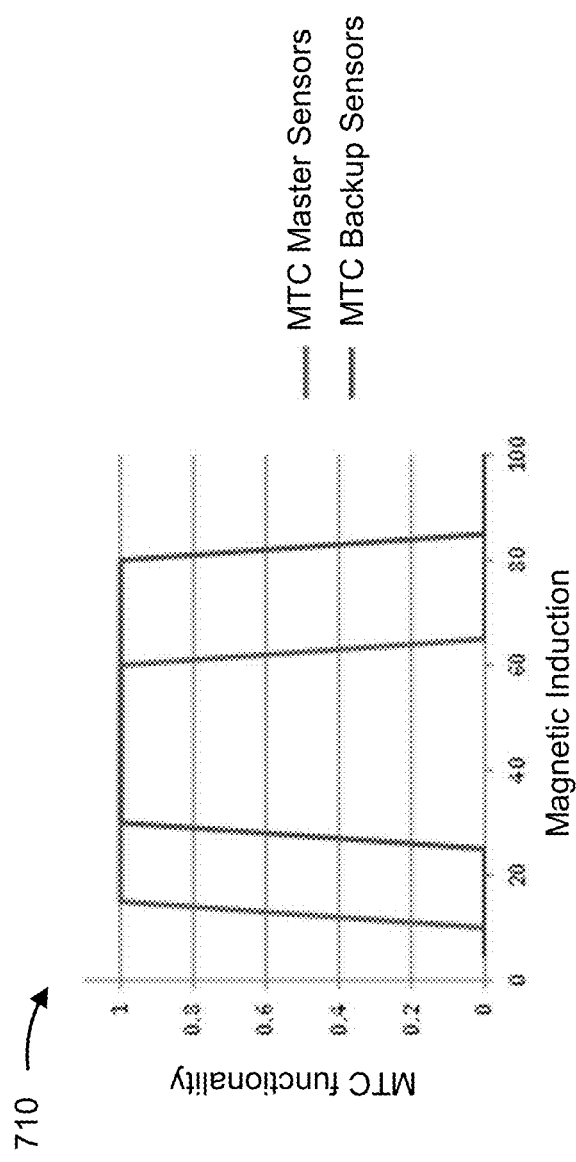

FIGS. 7A and 7B are diagrams of an example implementation 700 relating to example process 400 shown in FIG. 4. FIGS. 7A and 7B show an example implementation of an MTC system that includes multi-turn counter sensor failure detection. In FIG. 7A, four MTC sensors 220, shown as master MTC measurement sensor 220-1, master MTC monitor sensor 220-2, backup MTC measurement sensor 220-3, and backup MTC monitor sensor 220-4 (which may be referred to collectively as MTC sensors 220 and correspond to MTC sensors 220 of FIG. 2), and a controller 230 (which may correspond to controller 230 of FIG. 2). The MTC sensors 220 of example implementation 700 are configured to measure a turn count of magnet 210 as magnet 210 rotates about axis 215, similar to example implementation 500 and example implementation 600.

As shown in FIG. 7A, controller 230 uses master MTC sensors 220-1, 220-2 (that are inversely configured relative to one another) to determine the turn count of magnet 210 and monitor the accuracy of the determining the turn count and a set (or pair) of backup MTC sensors 220-3, 220-4 (that are inversely configured relative to one another) to be activated to determine the turn count when a failure is detected in the set of master MTC sensors 220. For example, when controller 230 determines that a failure occurs with master MTC measurement sensor 220-1 and/or master MTC monitor sensor 220-2, controller 230 may deactivate and/or disregard measurements from master MTC measurement sensor 220-1 and master MTC monitor sensor 220-2, and activate and/or obtain measurements from backup MTC measurement sensor 220-3 and backup MTC monitor sensor 220-4.

In some implementations, in the example implementation 700, master MTC sensors 220-1, 220-2 are a same type of MTC sensor and backup MTC sensors 220-3, 220-4 are a same type of MTC sensor. In some implementations, the master MTC sensors 220-1, 220-2 are a different type of MTC sensor than the backup MTC sensors 220-3, 220-4.

In FIG. 7B, a graph 710 shows master MTC sensors 220-1, 220-2, being a different type than backup MTC sensors 220-3, 220-4, having a lower maximum magnetic induction characteristic than backup MTC sensors 220-3, 220-4 (e.g., due to master MTC sensors 220-1, 220-2 having a magnetic strip with a thinner width than the backup MTC sensors 220-3, 220-4). In some aspects, backup MTC sensors 220-3, 220-4 may be suitable for operation at a higher magnetic induction than master MTC sensors 220-1, 220-2. As such, in some implementations, if master MTC sensors 220-1, 220-2 fail (e.g., due to a disturbance in the magnetic field that generates a domain wall within a structure of one or both of the master MTC sensors 220-1, 220-2), then controller 230 may utilize backup MTC sensors 220-3, 220-4 to determine the turn count of magnet 210. In such cases, backup MTC sensors 220-3, 220-4 may not encounter the same failure as master MTC sensors 220-1, 220-2 due to the relatively higher magnetic induction characteristics of backup MTC sensors 220-3, 220-4. For example, a disturbance in the magnetic field of magnet 210 may affect locations of domain walls within structures of master MTC sensors 220-1, 220-2 but not affect locations of domain walls within structures of backup MTC sensors 220-3, 220-4.

As indicated above, FIGS. 7A and 7B are provided merely as examples. Other examples are possible and may differ from what was described with regard to FIGS. 7A and 7B.

Figure 8:
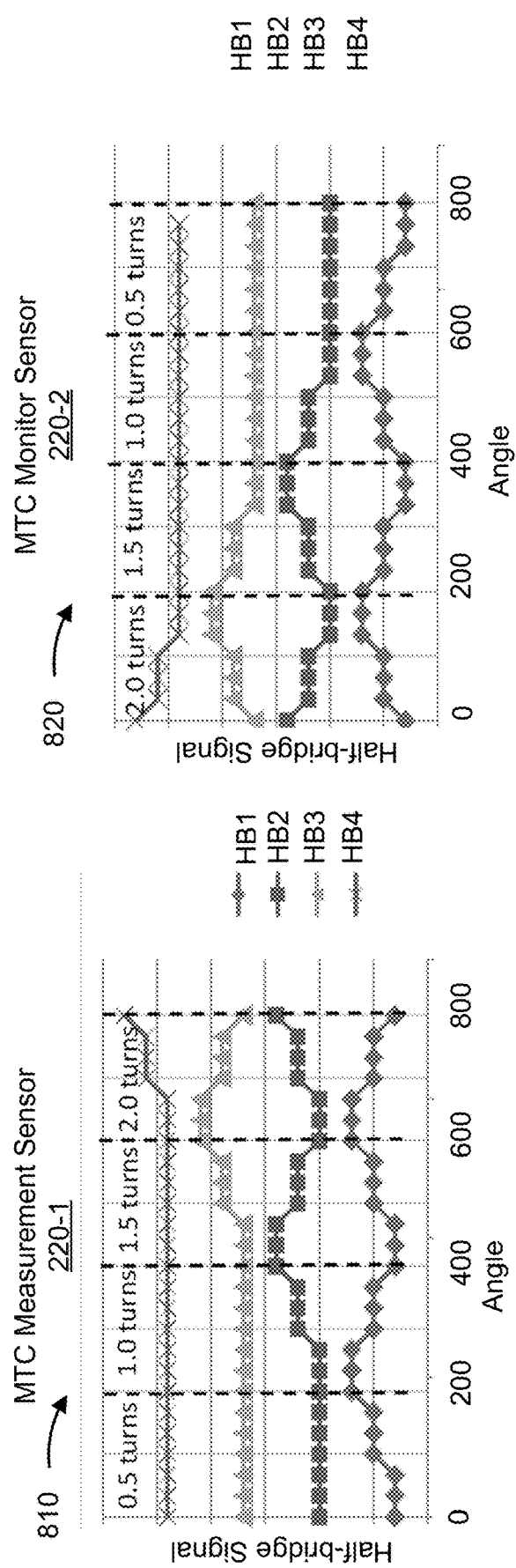
FIGS. 8-9 are diagrams of example implementations relating to the example process of FIG. 4.

FIG. 8 is a diagram associated with an example implementation of MTC sensor failure detection described herein. FIG. 8 includes graphs 810, 820 of example half-bridge signal measurements from MTC measurement sensor 220-1 and MTC monitor sensor 220-2 (referred to collectively as MTC sensors 220). According to some implementations, the example graphs 810, 820 may represent measurements from MTC sensors 220 that are operable to accurately determine a turn count associated with a magnet (e.g., magnet 210) as the magnet completes two rotations from an original position (shown as 0 degrees) to an end position (720 degrees). Assuming MTC measurement sensor 220-1 and MTC monitor sensor 220-2 are configured to inversely measure a magnetic field, controller 230 may sum the values of the measurements of the half-bridge signals to determine that the MTC sensors 220 are operable to accurately determine the turn count of magnet 210. However, in the event that one or more of the measurements of the half bridge signals, when received by controller 230, does not result in a fixed or constant sum, controller 230 may determine that at least one of MTC measurement sensor 220-1 or MTC monitor sensor 220-2 has failed or is not operable to accurately determine the turn count of the magnet.

As indicated above, FIG. 8 is provided merely as an example. Other examples are possible and may differ from what was described with regard to FIG. 8.

Figure 9:
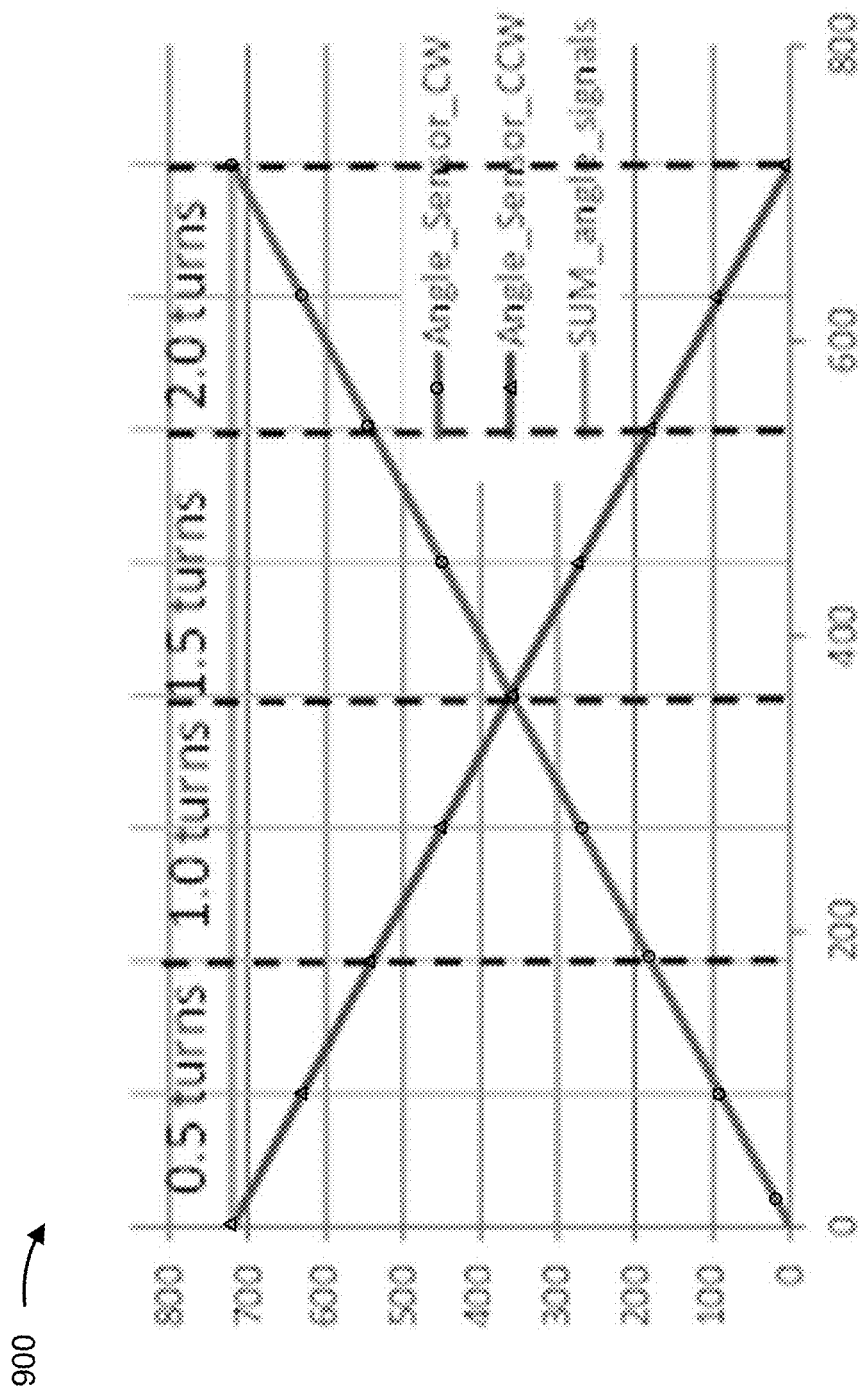

FIG. 9 is a diagram associated with an example implementation of MTC sensor failure detection described herein. FIG. 9 includes a graph 900 of angle sensor measurements of angle sensors that can be implemented in accordance with MTC sensors, as described herein. For example, controller 230 may use angle sensors to ensure that a measured angle of magnet 210 is accurate based on configuring at least one angle sensor (along with at least two MTC sensors 220). Accordingly, controller 230, as shown, may sum the measurements from the angle sensor(s) to achieve a constant measurement. In graph 900, the constant sum of the angles is 720 degrees, assuming the angle of rotation of magnet 210 ranges from 0 degrees to 720 degrees.

Accordingly, controller 230 may utilize one or more angle sensors in a similar fashion as MTC sensors 220 (e.g., configured to be inverted relative to one another and/or magnet 210), as described herein, to verify that the angle sensors and/or MTC sensors are operable to accurately measure an angle of rotation and/or turn count of magnet 210.

As indicated above, FIG. 9 is provided merely as an example. Other examples are possible and may differ from what was described with regard to FIG. 9.

Accordingly, as described herein, controller 230 may determine that MTC sensors 220 of an MTC system are operable to measure an accurate turn count of a rotatable object (and/or corresponding magnet) and/or detection of failures of one or more MTC sensors 220. As such, the MTC system can ensure that a machine, device, or other system (e.g., a steering system of a vehicle, a clutch system of a vehicle, and/or the like), that is using the MTC system, is operating under proper conditions. Furthermore, further failures, caused by or associated with inaccurate turn counts of a rotatable object, can be avoided in the MTC system and/or within a machine, device, or other system utilizing the MTC system. In such cases, processing resources, power resources, and/or the like can be conserved for the MTC system by avoiding use of inaccurate measurements and/or the failed MTC system.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A multi-turn counter (MTC) system comprising:
   a first MTC sensor configured to sense a rotating magnetic field coupled to a rotatable object,
      wherein the first MTC sensor has a first sense of rotation detection;
   a second MTC sensor configured to sense the rotating magnetic field,
      wherein the second MTC sensor has a second sense of rotation detection which is opposite to the first sense of rotation detection, and
      wherein the second MTC sensor is configured to sense the rotating magnetic field according to the second sense of rotation detection; and
   a controller configured to:
      receive measurements of the rotating magnetic field from the first MTC sensor and the second MTC sensor,
         wherein the measurements are associated with a turn count of the rotatable object;
      compare the measurements to verify whether at least one of the first MTC sensor or the second MTC sensor is operable to determine the turn count of the rotatable object; and
      perform an action based on comparing the measurements.

2. The MTC system of claim 1, wherein the controller is further configured to:
   detect a failure associated with the first MTC sensor or the second MTC sensor based on comparing the measurements; and
   wherein the controller, when performing the action, is configured to:
      perform a particular action associated with the failure.

3. The MTC system of claim 2, wherein the controller, when performing the particular action, is configured to:
   send a notification indicating that the first MTC sensor or the second MTC sensor failed.

4. The MTC system of claim 2, wherein the controller, when performing the particular action, is configured to:
   deactivate at least one of the first MTC sensor or the second MTC sensor; and
   activate one or more backup MTC sensors to determine the turn count of the rotatable object.

5. The MTC system of claim 4, wherein the one or more backup MTC sensors are a different type of MTC sensor than the first MTC sensor and the second MTC sensor.

6. The MTC system of claim 1, wherein the first MTC sensor and the second MTC sensor are a same type of sensor.

7. The MTC system of claim 1, wherein the first MTC sensor and the second MTC sensor are inversely configured and axially located on a same side of a magnet.

8. The MTC system of claim 1, wherein the first MTC sensor and the second MTC sensor are inversely configured and axially located on opposite sides of a magnet.

9. A device, comprising:
   one or more processors to:
      receive a first measurement of a magnetic field, associated with a magnet, from a first multi-turn counter (MTC) sensor,
         wherein the first MTC sensor senses the magnetic field while positioned in a first configuration;
      receive a second measurement of the magnetic field from a second MTC sensor,
         wherein the second MTC sensor senses the magnetic field while positioned in a second configuration that causes the second MTC sensor to inversely sense the magnetic field relative to the first MTC sensor,
      determine a sum of the first measurement and the second measurement;
      determine whether the sum is different from a previous sum of measurements from the first MTC sensor and the second MTC sensor;
      determine, based on whether the sum is different from the previous sum, whether at least one of the first MTC sensor or the second MTC sensor is operable to measure a turn count of the magnet; and perform an action based on whether at least one of the first MTC sensor or the second MTC sensor are operable to determine the turn count of the magnet.

10. The device of claim 9, wherein the one or more processors, when determining whether the sum is different from the previous sum, are to:
determine that the sum is different from the previous sum; and
wherein the one or more processors, when determining whether at least one of the first MTC sensor or the second MTC sensor is operable to measure the turn count of the magnet, are to:
determine that at least one of the first MTC sensor or the second MTC sensor is not operable to determine the turn count of the magnet based on the sum being different from the previous sum.

11. The device of claim 9, wherein the one or more processors, when determining whether sum is different from the previous sum, are to:
determine that the sum is substantially similar to the previous sum; and
wherein the one or more processors, when determining whether at least one of the first MTC sensor or the second MTC sensor is operable to measure the turn count of the magnet, are to:
determine that the first MTC sensor and the second MTC sensor are operable to determine the turn count of the magnet based on the sum being substantially similar to the previous sum.

12. The device of claim 9, wherein the one or more processors, when determining whether at least one of the first MTC sensor or the second MTC sensor is operable to measure the turn count of the magnet, are to:
determine that at least one of the first MTC sensor or the second MTC sensor is not operable to determine the turn count of the magnet based on the sum being different from the previous sum; and
wherein the one or more processors, when performing the action, are to:
transmit a notification to a user interface associated with the device to cause the user interface to indicate that at least one of the first MTC sensor or the second MTC sensor is not operable to measure the turn count of the magnet.

13. The device of claim 9, wherein the one or more processors, when determining whether at least one of the first MTC sensor or the second MTC sensor is operable to measure the turn count of the magnet, are to:
determine that at least one of the first MTC sensor or the second MTC sensor is not operable to determine the turn count of the magnet based on the sum being different from the previous sum; and
wherein the one or more processors, when performing the action, are to:
deactivate the first MTC sensor and the second MTC sensor based on determining that at least one of the first MTC sensor or the second MTC sensor is not operable to determine the turn count of the magnet; and
activate a first backup MTC sensor and a second backup MTC sensor,
wherein the first backup MTC sensor is configured to inversely measure the magnetic field relative to the second backup MTC sensor.

14. The device of claim 13, wherein the first MTC sensor and the second MTC sensor are both a first type of MTC sensor; and
wherein the first backup MTC sensor and the second backup MTC sensor are both a second type of MTC sensor,
the second type of MTC sensor having a higher magnetic induction characteristic than the first type of MTC sensor or being suitable for operation at a higher magnetic induction than the first type of MTC sensor.

15. A method, comprising:
receiving, by a device, a first set of measurements of a magnetic field, associated with a magnet, from a pair of multi-turn counter (MTC) sensors,
wherein the pair of MTC sensors are configured to inversely measure the magnetic field;
calculating a sum of the first set of measurements of the magnetic field;
receiving, by the device, a second set of measurements of the magnetic field from the pair of MTC sensors,
wherein the second set of measurements are received after the first set of measurements;
calculating, by the device, a sum of the second set of measurements;
comparing, by the device, the sum of the first set of measurements with the sum of the second set of measurements;
determining, by the device, that at least one of the pair of MTC sensors is not operable to measure a turn count of the magnet when the sum of the first set of measurements is different from the sum of the second set of measurements; and
performing, by the device, an action associated with at least one of the pair of MTC sensors not being operable to measure the turn count of the magnet.

16. The method of claim 15, wherein comparing the sum of the first set of measurements and the sum of the second set of measurements comprises:
determining whether the sum of the first set of measurements is different from the sum of the second set of measurements.

17. The method of claim 15, wherein the pair of MTC sensors are configured to inversely measure the magnetic field associated with the magnet based on the pair of MTC sensors being configured in an inverse orientation relative to one another on a same axial side of the magnet.

18. The method of claim 15, wherein the first set of measurements comprises a first measurement from a first one of the pair of MTC sensors and a first measurement from a second one of the pair of MTC sensors that are measured at a first time, and
wherein the second set of measurements comprises a second measurement from the first one of the pair of MTC sensors and a second measurement from the second one of the pair of MTC sensors that are measured at a second time.

19. The method of claim 15, wherein performing the action comprises:
sending a notification that at least one of the pair of MTC sensors are not operable to measure the turn count of the magnet.

20. The method of claim 15, wherein performing the action comprises:
using a pair of backup MTC sensors, that are different from the pair of MTC sensors, to determine the turn count of the magnet.

* * * * *